(12) United States Patent
Shiomi et al.

(10) Patent No.: US 10,720,471 B2
(45) Date of Patent: Jul. 21, 2020

(54) PHOTOELECTRIC CONVERSION DEVICE AND IMAGING DEVICE

(71) Applicant: SONY CORPORATION, Tokyo (JP)

(72) Inventors: Michinori Shiomi, Kanagawa (JP); Syuuiti Takizawa, Tokyo (JP); Takeru Bessho, Kanagawa (JP); Hideki Ono, Tokyo (JP); Yosuke Saito, Tokyo (JP); Yoshiaki Obana, Kanagawa (JP); Daisuke Hobara, Kanagawa (JP)

(73) Assignee: Sony Corporation, Toyko (JP)

( * ) Notice: Subject to any disclaimer, the term of this patent is extended or adjusted under 35 U.S.C. 154(b) by 171 days.

(21) Appl. No.: 15/765,316

(22) PCT Filed: Aug. 16, 2016

(86) PCT No.: PCT/JP2016/073884
§ 371 (c)(1),
(2) Date: Apr. 2, 2018

(87) PCT Pub. No.: WO2017/061174
PCT Pub. Date: Apr. 13, 2017

(65) Prior Publication Data
US 2018/0294315 A1  Oct. 11, 2018

(30) Foreign Application Priority Data

Oct. 9, 2015 (JP) .................................. 2015-201439

(51) Int. Cl.
*H01L 27/30* (2006.01)
*H01L 27/146* (2006.01)
*H01L 51/44* (2006.01)

(52) U.S. Cl.
CPC .......... *H01L 27/307* (2013.01); *H01L 27/146* (2013.01); *H01L 27/14665* (2013.01);
(Continued)

(58) Field of Classification Search
CPC ............. H01L 27/307; H01L 27/14665; H01L 27/146; H01L 51/447; H01L 51/441; Y02E 10/549
See application file for complete search history.

(56) References Cited

U.S. PATENT DOCUMENTS

2008/0035965 A1* 2/2008 Hayashi ............ H01L 27/14647
257/291

FOREIGN PATENT DOCUMENTS

| JP | 2005-216677 | 8/2005 |
| JP | 2005-353401 | 12/2005 |
| JP | 2008-072090 | 3/2008 |

OTHER PUBLICATIONS

International Search Report prepared by the Japan Patent Office dated Oct. 11, 2016, for International Application No. PCT/JP2016/073884.

* cited by examiner

*Primary Examiner* — Karen Kusumakar
(74) *Attorney, Agent, or Firm* — Sheridan Ross P.C.

(57) ABSTRACT

A photoelectric conversion device of an embodiment of the technology includes: a first electrode and a second electrode facing each other; a photoelectric conversion layer provided between the first electrode and the second electrode; and a buffer layer provided between the first electrode and the photoelectric conversion layer, and having an interface, to which an organic molecule or a halogen element is coordinated, with the photoelectric conversion layer.

20 Claims, 6 Drawing Sheets

(52) U.S. Cl.
CPC .......... *H01L 51/441* (2013.01); *H01L 51/447* (2013.01); *Y02E 10/549* (2013.01)

PHOTOELECTRIC CONVERSION DEVICE AND IMAGING DEVICE

CROSS REFERENCE TO RELATED APPLICATIONS

This application is a national stage application under 35 U.S.C. 371 and claims the benefit of PCT Application No. PCT/JP2016/073884 having an international filing date of 16 Aug. 2016, which designated the United States, which PCT application claimed the benefit of Japan Patent Application No. 2015-201439 filed 9 Oct. 2015, the entire disclosures of each of which are incorporated herein by reference.

TECHNICAL FIELD

The present disclosure relates to, for example, a photoelectric conversion device and an imaging device that use an organic pigment.

BACKGROUND ART

In recent years, a pixel size has been reduced for imaging units (solid-state imaging units) such as a CCD (Charge Coupled Device) image sensor and a CMOS (Complementary Metal Oxide Semiconductor) image sensor. As a result, the number of photons that enter a unit pixel (an imaging device) has decreased, and an S/N ratio has been reduced, thereby causing a reduction in sensitivity and the reduction in S/N ratio. In addition, in a case where a color filter configured by two-dimensionally arranging red, green, and blue primary color filters is used for coloring, in a red pixel, which results in a reduction in sensitivity. Moreover, in a case where each color signal is generated, interpolation processing is performed between pixels and thus a so-called false color is produced.

For example, PTL 1 discloses an imaging device in which an organic photoelectric conversion film including one layer is formed, a signal of one color is extracted by this organic photoelectric conversion film, and signals of two colors are extracted by silicon (Si) bulk spectroscopy. In such an imaging device, as electric field intensity to be applied to the photoelectric conversion film is higher, external quantum efficiency (EQE) in the photoelectric conversion film during application of light is larger. However, in a case where a large external voltage is applied, an electron or a hole is injected into the photoelectric conversion film from a pair of electrodes with the photoelectric conversion film interposed therebetween. This causes an increase in dark current and a decrease in S/N ratio.

In contrast, for example, PTL 2 discloses a solid-state imaging device that prevents generation of a dark current by providing an electron blocking layer and a hole blocking layer between a photoelectric conversion layer and a pair of electrodes.

CITATION LIST

Patent Literature

PTL 1: Japanese Unexamined Patent Application Publication No. 2005-303266
PTL 2: Japanese Unexamined Patent Application Publication No. 2012-160770

SUMMARY OF INVENTION

In general, in consideration of response characteristics and heat resistance, it is preferable that an inorganic material rather than an organic material be used for an electron blocking layer and a hole blocking layer. However, as described in PTL 2, a device using an inorganic material for an electron blocking layer and a hole blocking layer has such an issue that a sufficient improvement in S/N ratio is not observed.

It is therefore desirable to provide a photoelectric conversion device and an imaging device that make it possible to enhance device characteristics such as an S/N ratio.

A photoelectric conversion device according to an embodiment of the technology includes: a first electrode and a second electrode facing each other, a photoelectric conversion layer provided between the first electrode and the second electrode; and a buffer layer provided between the first electrode and the photoelectric conversion layer, and having an interface, to which an organic molecule or a halogen element is coordinated, with the photoelectric conversion layer.

An imaging device according to an embodiment of the technology includes pixels each including one or a plurality of organic photoelectric converters, and includes the above-described photoelectric conversion device according to the embodiment of the technology as each of the organic photoelectric converters.

In the photoelectric conversion device according to the embodiment of the technology and the imaging device according to the embodiment of the technology, the buffer layer is provided between the first electrode and the photoelectric conversion layer, and the organic molecule or the halogen element is coordinated to the interface of this buffer layer with the photoelectric conversion layer. This terminates a surface state, which is present on a surface of the buffer layer, of the interface with the photoelectric conversion layer.

According to the photoelectric conversion device in the embodiment of the technology and the imaging device in the embodiment of the technology, the organic molecule or the halogen element is coordinated to the interface of the buffer layer with the photoelectric conversion layer, and thus the surface state of the interface of the buffer layer with the photoelectric conversion layer is terminated, and generation of a dark current is reduced. This makes it possible to enhance device characteristics such as an S/N ratio. It is to be noted that effects described herein are not necessarily limited, and any of effects described in the present disclosure may be included.

MODES FOR CARRYING OUT THE INVENTION

Figure 1:
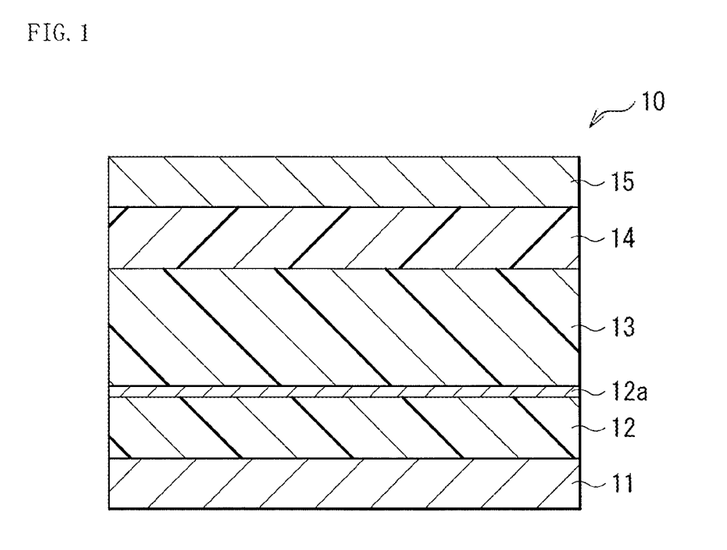
FIG. 1 is a cross-sectional view of a schematic configuration of a photoelectric converter according to an embodiment of the technology.

Some embodiments of the technology are described below in detail with reference to the drawings. It is to be noted that the description is given in the following order.
1. Embodiment (a photoelectric converter including an intermediate layer between a buffer layer and a photoelectric conversion layer)
  1-1. Basic Configuration
  1-2. Method of Manufacturing
  1-3. Workings and Effects
2. Application Examples (a Photoelectric Conversion Device and an Imaging Unit provided therewith)
3. Examples 1. Embodiment FIG. 1 illustrates a cross-sectional configuration of a photoelectric converter 10 according to an embodiment of the technology. The photoelectric converter 10 represents a configuration including a photoelectric conversion layer and its surroundings of for example, a photoelectric conversion device configuring a solar battery, or, for example, an imaging device (see photoelectric converters 10A and 10B in FIGS. 5 and 6 described later) configuring one pixel (e.g., a pixel P in FIG. 7 described later) in an imaging unit (e.g., an imaging unit 1 in FIG. 7 described later) such as a CCD image sensor or a CMOS image sensor. The photoelectric converter 10 includes a photoelectric conversion layer 13 between a pair of electrodes (a lower electrode 11 and an upper electrode 15). The photoelectric converter 10 further includes a buffer layer (a buffer layer 12) between the lower electrode 11 and the photoelectric conversion layer 13, and a buffer layer (a buffer layer 14) between the upper electrode 15 and the photoelectric conversion layer 13. The photoelectric converter 10 of the present embodiment has such a configuration that an intermediate layer 12a is formed at an interface of the buffer layer 12 with the photoelectric conversion layer 13, and reads, for example, a hole as a signal charge.

(1-1. Basic Configuration)

The photoelectric converter 10 has, as described above, such a configuration that the buffer layer 12, the photoelectric conversion layer 13, the buffer layer 14, and the upper electrode 15 stacked in this order on the lower electrode 11.

The lower electrode 11 extracts a signal charge (here, a hole) generated in the photoelectric conversion layer 13. The lower electrode 11 includes, for example, a light-transmissive conductive material, e.g., ITO (Indium-Tin-Oxide). The lower electrode 11 may include, for example, a tin oxide ($SnO_2$) base material or a zinc oxide (ZnO) base material. The tin oxide base material is a material prepared by adding a dopant to tin oxide. Examples of the zinc oxide base material include aluminum zinc oxide (AZO) prepared by adding aluminum (Al) as a dopant to zinc oxide, gallium zinc oxide (GZO) prepared by adding gallium (Ga) as a dopant to zinc oxide, and indium zinc oxide (IZO) prepared by adding indium (In) as a dopant to zinc oxide. It is also possible to use other materials such as IGZO, CuI, $InSbO_4$, ZnMgO, $CuInO_2$, $MgIn_2O_4$, CdO, and $ZnSnO_3$. The lower electrode 11 has a thickness (a thickness in a lamination direction, which is hereinafter simply referred to as thickness) of, for example, 50 nm to 500 nm both inclusive.

In the buffer layer 12, preferably, an electron injection barrier is greater than that of an adjacent electrode (the lower electrode 11), and mobility of a hole serving as a photocurrent carrier is higher than mobility of an electron. For this buffer layer 12, it is preferable to use a material having an electron affinity equal to or less than a work function of a material of the adjacent lower electrode 11, and having an ionization potential equal to or less than an ionization potential of a material of the adjacent photoelectric conversion layer 13. Specifically, a p-type semiconductor is used, and examples of the p-type semiconductor include inorganic materials such as nickel oxide (NiO), copper oxide ($Cu_2O$) $CuAlO_2$, $CuGaO_2$, LaCuOS, and $SrCu_2O_2$.

It is to be noted that in a case where the lower electrode 11 extracts an electron as a signal charge, in the buffer layer 12, preferably, a hole injection barrier is greater than that of an adjacent electrode (the lower electrode 11), and mobility of an electron serving as a photocurrent carrier is higher than mobility of a hole. For this buffer layer 12, it is preferable to use a material having an ionization potential equal to or more than a work function of a material of the adjacent upper electrode 15, and having an electron affinity equal to or more than an electron affinity of the material of the adjacent photoelectric conversion layer 13. Specifically, an n-type semiconductor is used, and examples of the n-type semiconductor include inorganic materials such as titanium oxide ($TiO_2$), zinc oxide (ZnO), zinc sulphide (ZnS), $SrTiO_3$, niobium oxide ($Nb_2O_5$), tungsten oxide ($WO_3$), indium oxide ($In_2O_3$), $CuTiO_3$, tin oxide ($SnO_2$), $InGaZnO_4$, $InTiO_2$, and $\beta\text{-}Ga_2O_3$.

The photoelectric conversion layer 13 absorbs light of a selective wavelength region and photoelectrically converts the absorbed light, while allowing light of other wavelength regions to pass therethrough. The photoelectric conversion layer 13 is formed including, for example, an organic pigment. Examples of the organic pigment include quinacridone (QD) and derivatives thereof, and subphthalocyanine and derivatives thereof. Further, examples of a blue organic pigment include coumarin derivatives, silole derivatives, and fluorene, examples of a green organic pigment include rhodamine derivatives, and examples of a red organic pigment include zinc phthalocyanine. The photoelectric conversion layer 13 may include an inorganic semiconductor, in addition to the organic pigment. Examples of the inorganic semiconductor include $TiO_2$, ZnO, $WO_3$, NiO, $MoO_3$, CuO, $Ga_2O_3$, $SrTiO_3$, $SnO_2$, InSnOx, $Nb_2O_3$, $MnO_2$, $V_2O_3$, CrO, $CuInSe_2$, $CuInS_2$, $AgInS_2$, Si, PbS, PbSe, PbTe, CdS, CdSe, CdTe, $Fe_2O_3$, GaAs, GaP, InP, InAs, Ge, $In_2S_3$, $Bi_2S_3$, ZnSe, ZnTe, and ZnS. Moreover, the photoelectric conversion layer 13 may include a colloidal quantum dot, or, for example, an organic-inorganic perovskite compound expressed by $CH_3NH_3PbX_3$ (X: halogen). The photoelectric conversion layer 13 has a thickness of, for example, 0.05 μm to 10 μm both inclusive.

In the buffer layer 14, preferably, a hole injection barrier is greater than that of an adjacent electrode (the upper electrode 15), and mobility of an electron serving as a photocurrent carrier is higher than mobility of a hole. For this buffer layer 14, it is preferable to use a material having an ionization potential equal to or more than a work function of a material of the adjacent upper electrode 15, and having an electron affinity equal to or more than the electron affinity of the material of the photoelectric conversion layer 13.

Specifically, an n-type semiconductor is used, and examples of the n-type semiconductor include inorganic materials such as titanium oxide ($TiO_2$), zinc oxide (ZnO), zinc sulphide (ZnS), $InGaZnO_4$, $InTiO_2$, and $\beta$-$Ga_2O_3$. Further, an n-type organic semiconductor material may be used, and examples of the n-type organic semiconductor material include an organic metal pigment, which is a complex formed using a transition metal ion and an organic material, typified by zinc phthalocyanine (II), and dinaphthothienothiophene (DNTT).

It is to be noted that in a case where the lower electrode 11 extracts an electron as a signal charge, in the buffer layer 14, preferably, an electron injection barrier is greater than that of an adjacent electrode (the lower electrode 15), and mobility of a hole serving as a photocurrent carrier is higher than mobility of an electron. For this buffer layer 14, it is preferable to use a material having an electron affinity equal to or less than a work function of the material of the adjacent lower electrode 11, and having an ionization potential equal to or less than the ionization potential of the material of the adjacent photoelectric conversion layer 13. Specifically, a p-type semiconductor is used, and examples of the p-type semiconductor include inorganic materials such as nickel oxide (NiO), $CuAlO_2$, $CuGaO_2$, LaCuOS, and $SrCu_2O_2$. Further, an n-type organic semiconductor material may be used. Examples of the n-type organic semiconductor material include an organic pigment typified by quinacridone and derivatives thereof, and a pigment formed by chelating a preperiodic (referring to a metal on the left side of the periodic table) ion typified by Alq3[tris(8-quinolinolato) aluminum (III)] through use of an organic material.

The upper electrode 15 extracts a signal charge (an electron) generated in the photoelectric conversion layer 13. The upper electrode 15 includes, for example, a conductive material such as gold (Au), silver (Ag), copper (Cu), and aluminum (Al). As with the lower electrode 11, the upper electrode 15 may include a transparent conductive material. The upper electrode 15 has a thickness of, for example, 10 nm to 100 nm both inclusive.

Figure 2:
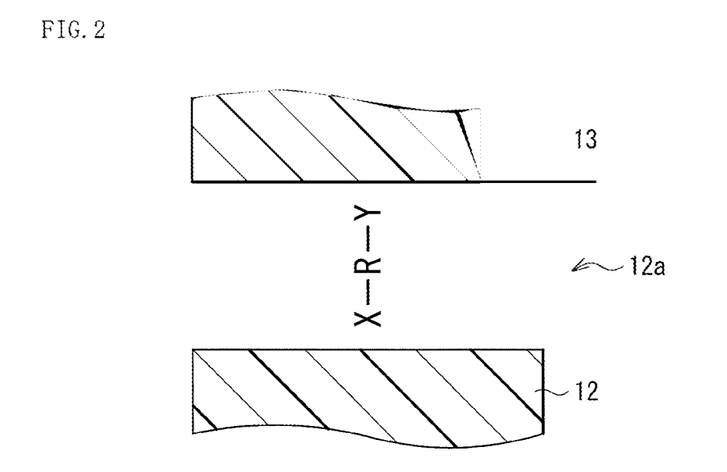
FIG. 2 is a schematic diagram illustrating a configuration of the photoelectric converter illustrated in FIG. 1.

In the present embodiment, as described above, the intermediate layer 12a is formed at the interface between the buffer layer 12 and the photoelectric conversion layer 13. The intermediate layer 12a includes an organic molecule or a halogen element of a monolayer or submonolayer order, and is formed by coordination of the organic molecule or the halogen element to an inorganic material (e.g., NiO) of a surface of the buffer layer 12. The organic molecule includes, for example, two adsorptive functional groups (X and Y), between which a main chain (R) mainly having, for example, a hydrocarbon is provided (see FIG. 2). In a case where the intermediate layer 12a includes this organic molecule, the intermediate layer 12a has such a configuration that one adsorptive functional group (here, X) of these two adsorptive functional groups is coordinated to NiO of the surface of the buffer layer 12, and the other adsorptive functional group (here, Y) is coordinated to a material (for example, an organic pigment) of the photoelectric conversion layer 13, as illustrated in FIG. 2.

The main chain (R) of the organic molecule includes, for example, a straight-chain hydrocarbon, a chain hydrocarbon having a side chain, or an aromatic hydrocarbon. Examples of the adsorptive functional groups X and Y independently of each other include methanethiol, ethanethiol, 1-propanethiol, 2-propanethiol, 1-butylthiol, a mercapto (—SH) group such as trifluorothiol, a hydroxyl (—OH) group, an alkoxy (—O—) group, a peroxy (—O—O—) group, an acyl (R—CO—) group, an aldehyde (R—CHO—) group, an acetyl ($CH_3$—CO—) group, a benzoyl ($C_6H_5$—CO—) group, a carboxyl (—COOH) group, a carbonyl group or keto group expressed by >C=—O, a malonyl (—CO-CH2-CO—) group, an amide (—CO—NRR') group, an imide (—CO—NH—R) group, a (—CN nitrile) group, a chloro (—Cl) group, a bromo (—Br) group, a iodine (—I) group, a fluoro (—F) group, an amino (—$NH_2$) group, an imino (=NH) group, an N-oxide (N-+O) group, an N-hydroxy (—NH—OH) group, a nitro (—NO2) group, a nitroso (—NO) group, an azo (—N=N—) group, a diazo (~N+=N) group, an oxy group or epoxy group expressed by —O—, a thio (—S—) group, an S-oxide (S→O) group, a thioxy (=S) group, a phosphonic acid (—P(OH)$_2$) group, an alkenyl group, a heterocyclic group, a silyl group, a cyano group, a cycloalkyloxy group, an aryloxy group, a heterocyclicoxy group, a silyloxy group, an acyloxy group, an alkoxycarbonyloxy group, an aryloxycarbonyloxy group, a carbamoyloxy group, a sulfamoyloxy group, an alkylsulfonyloxy group, an arylsulfonyloxy group, an alkoxycarbonyl group, an aryloxycarbonyl group, a carbamoyl group, an anilino group, a heterocyclicamino group, a carbonamide group, an ureido group, an alkoxycarbonyl amino group, an aryloxycarbonyl amino group, a sulfonamide group, a sulfamoylamino group, an alkylthio group, an arylthio group, a heterocyclicthio group, an alkylsulfinyl group, an arylsulfinyl group, an alkylsulfonyl group, an arylsulfonyl group, a sulfamoyl group, a sulfo group, a phosphonyl group, and a phosphinoylamino group. Among the above-described adsorptive functional groups, in particular, the carboxyl (—COOH) group, the mercapto (—SH) group, the phosphonyl (>P—O) group, and the phosphonic acid (—P(=O)(OH)$_2$) group are preferable.

The organic molecule preferably has a length of, for example, 1 nm or less. For this reason, the main chain (R) preferably has a carbon number of, for example, 1 or more and 6 or less. Specifically, for example, in a case of an alkyl chain expressed by —($CH_2$)n- or a fluorine-substituted alkyl chain expressed by —($CF_2$)n-, n is preferably 1 or more and 4 or less. Further, the main chain (R) may be a phenyl group (carbon number of 6) expressed by —($C_6H_4$)n-. Examples of an organic molecule having such a configuration include 3-mercaptopropionic acid (MPA), ethyl phosphoric acid, propyl phosphoric acid, ethanethiol, propanethiol, acetic acid, ethylcarboxylic acid, propylcarboxylic acid, etc. It is to be noted that, the intermediate layer 12a preferably has a thickness substantially the same as a length for one organic molecule, e.g., a thickness of 1 nm or less.

It is to be noted that the example in which the organic molecule has the two adsorptive functional groups X and Y with the main chain R provided therebetween, and these two adsorptive functional groups X and Y are coordinated to the surface of the buffer layer 12 and the surface of the photoelectric conversion layer 13, respectively is described here, but there is no limitation thereto. For example, in a case where a material of the photoelectric conversion layer 13 described later has an adsorptive functional group, the organic molecule may include at least one adsorptive functional group. In this case, the organic molecule preferably includes, for example, the adsorptive functional group X on one side of the main chain R, and hydrogen (H) or fluorine (F) on the other side. Further, in this case, the adsorptive functional group X is coordinated to an inorganic material of the surface of the buffer layer 12, and the adsorptive functional group included in the material (for example, an organic pigment) of the photoelectric conversion layer 13 is coordinated to H or F, thereby forming a bond.

(1-2. Method of Manufacturing)

It is possible to manufacture such an intermediate layer 12a as follows, for example.

First, for example, an ITO film is formed as the lower electrode 11 by sputtering, and then, for example, the buffer layer 12 including NiO is formed by sputtering on the ITO film. Subsequently, for example, a laminated film of ITO and NiO (the lower electrode 11/the buffer layer 12) is immersed in an MPA methanol solution (MPA in MeOH (0.12 mol/L)) for 20 hours, and then immersed in acetonitrile (MeCN) for 1 minute. The laminated film is then dried by air blowing. Accordingly, MPA is coordinated to NiO of a surface of the buffer layer 12 through a carboxyl group to form the intermediate layer 12a on the surface of the buffer layer 12. Next, for example, a quinacridone (QD) film is formed on the intermediate layer 12a by using, for example, vapor deposition, thereby forming the photoelectric conversion layer 13. Lastly, for example, an organic film is formed on the photoelectric conversion layer 13 by using vapor deposition, thereby forming the buffer layer 14, and thereafter, for example, an AlSiCu film is formed by using vapor deposition, thereby forming the upper electrode 15. This completes the photoelectric converter 10 illustrated in FIG. 1.

(1-3. Workings and Effects)

For an imaging unit such as an image sensor, or the like, a device with higher sensitivity has been developed to suppress a decrease in S/N ratio associated with a reduction in pixel size. Examples of such a device include the above-described imaging device in which a signal of one color is extracted by the organic photoelectric conversion film including one layer, and signals of two colors are extracted by silicon bulk spectroscopy, and an organic photoelectric conversion device in which a plurality of photoelectric converters each having an active layer between a pair of electrodes are stacked. The active layer uses an organic semiconductor material that absorbs light of a specific wavelength region. Such an imaging device (a photoelectric conversion device) has an issue as follows. In a case where a large external voltage is applied, an electric charge (an electron or a hole) is injected from a pair of electrodes holding a photoelectric conversion film therebetween to the photoelectric conversion film, thereby causing an increase in dark current, which then causes a decrease in S/N ratio. This decrease in S/N ratio due to the increase in dark current is reduced by providing a corresponding carrier blocking layer between the photoelectric conversion film and the electrode.

For a material for formation of the carrier blocking layer, it is preferable to use an inorganic material, considering responsivity and heat resistance. However, actually, it is difficult to improve the S/N ratio sufficiently, because the dark current easily increases and external quantum efficiency (EQE) easily drops. For this reason, in general, the carrier blocking layer is formed including an organic semiconductor material. It is conceivable that this results from an influence of an energy level (a surface state) to be formed on a surface of the carrier blocking layer formed including an inorganic material.

Figure 3:
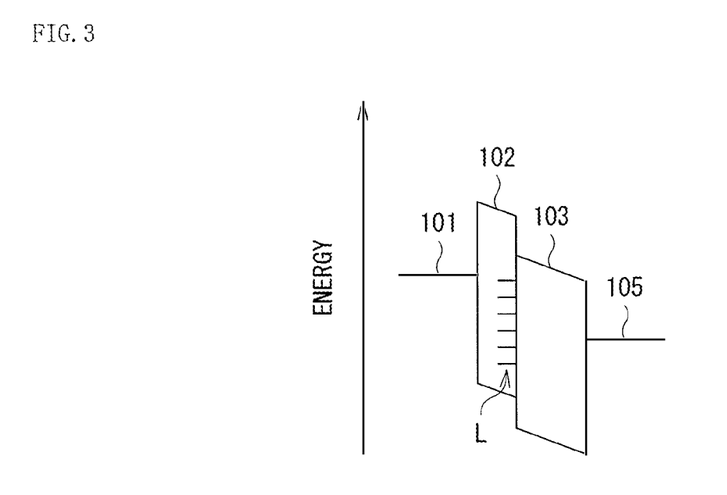
FIG. 3 is an energy diagram of a general photoelectric conversion layer and a general buffer layer.

FIG. 3 illustrates an energy diagram in a case where an external voltage is applied to a pair of electrodes 101 and 105 holding a buffer layer 102 and a photoelectric conversion layer 103 therebetween. The buffer layer 102 and the photoelectric conversion layer 103 are stacked directly. As described above, a surface state L is present on a surface of the buffer layer 102 including an inorganic material as illustrated in FIG. 3A. The surface state L of the buffer layer 102 including the inorganic material is densely formed at a position relatively deeper than a surface state to be formed on a surface of a buffer layer including an organic material.

Figure 4:
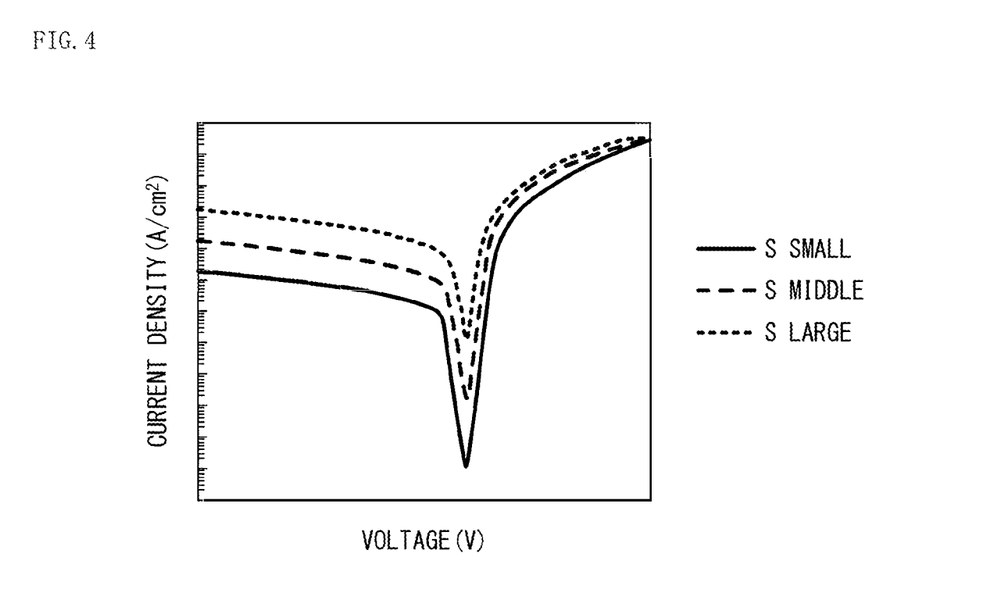
FIG. 4 is a characteristic diagram illustrating a relationship between current density and voltage.

For this reason, for example, thermal excitation of an electron easily occurs through the surface state L of the buffer layer 102, which increases a dark current in a case where an external voltage is applied to the electrodes 101 and 105. In addition, an exciton (a pair of a hole and an electron) generated in the photoelectric conversion layer 103 by optical excitation or the like is easily recombined through the surface state L of the surface of the buffer layer 102, leading to a drop in EQE. FIG. 4 illustrates a relationship between current density and voltage at each surface recombination speed (S). Since the surface recombination speed increases as the surface state grows, it is apparent that the amount of current increases as the surface recombination speed increases. In other words, it is apparent that the dark current increases as the surface state grows.

Hence, in the present embodiment, for example, the buffer layer 12 is formed between the lower electrode 11 and the photoelectric conversion layer 13. The buffer layer 12 includes an inorganic material, and includes the intermediate layer 12a at the interface with the photoelectric conversion layer 13. This intermediate layer 12a includes an organic molecule or a halogen element, which is coordinated to the inorganic material of the surface of the buffer layer 12, thereby terminating a surface state present on the surface of the buffer layer 12 by the organic molecule or the halogen element. Accordingly, generation of a dark current is reduced. Moreover, recombination of an exciton is suppressed.

As described above, in the photoelectric converter 10 of the present embodiment, since the organic molecule or the halogen element is coordinated to the interface of the buffer layer 12 with the photoelectric conversion layer 13, the surface state of the buffer layer 12 is terminated, and the generation of the dark current is suppressed. The S/N ratio is therefore improved. In addition, the recombination of the exciton is suppressed, which makes it possible to enhance EQE. In other words, it is possible to enhance device characteristics of a photoelectric conversion device 10A or 10R including the photoelectric converter 10, and, for example, the imaging unit 1 including this device.

2. Application Examples

Figure 5:
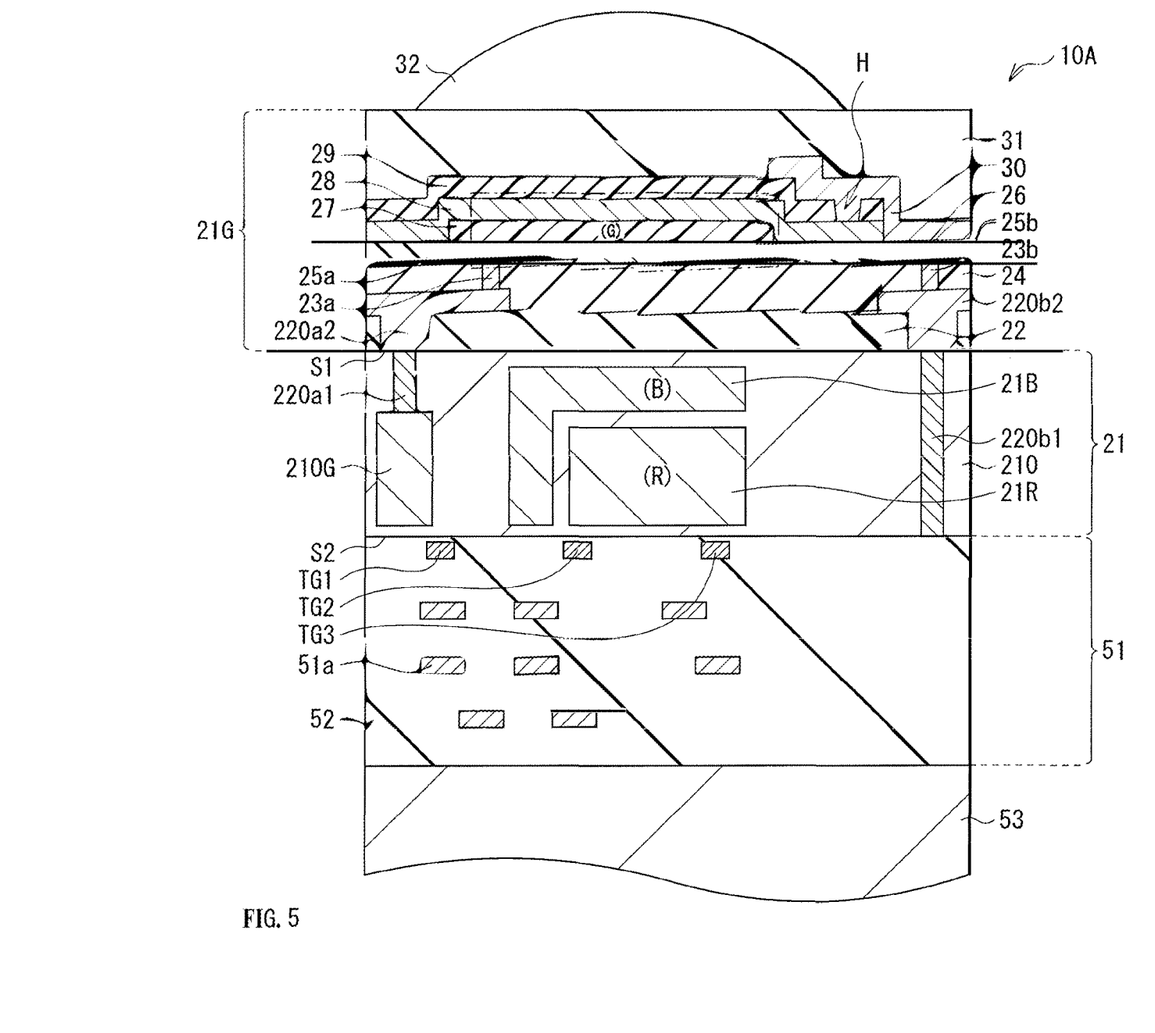
FIG. 5 is a diagram illustrating a configuration of a photoelectric conversion device including the photoelectric converter illustrated in FIG. 1.
Figure 6:
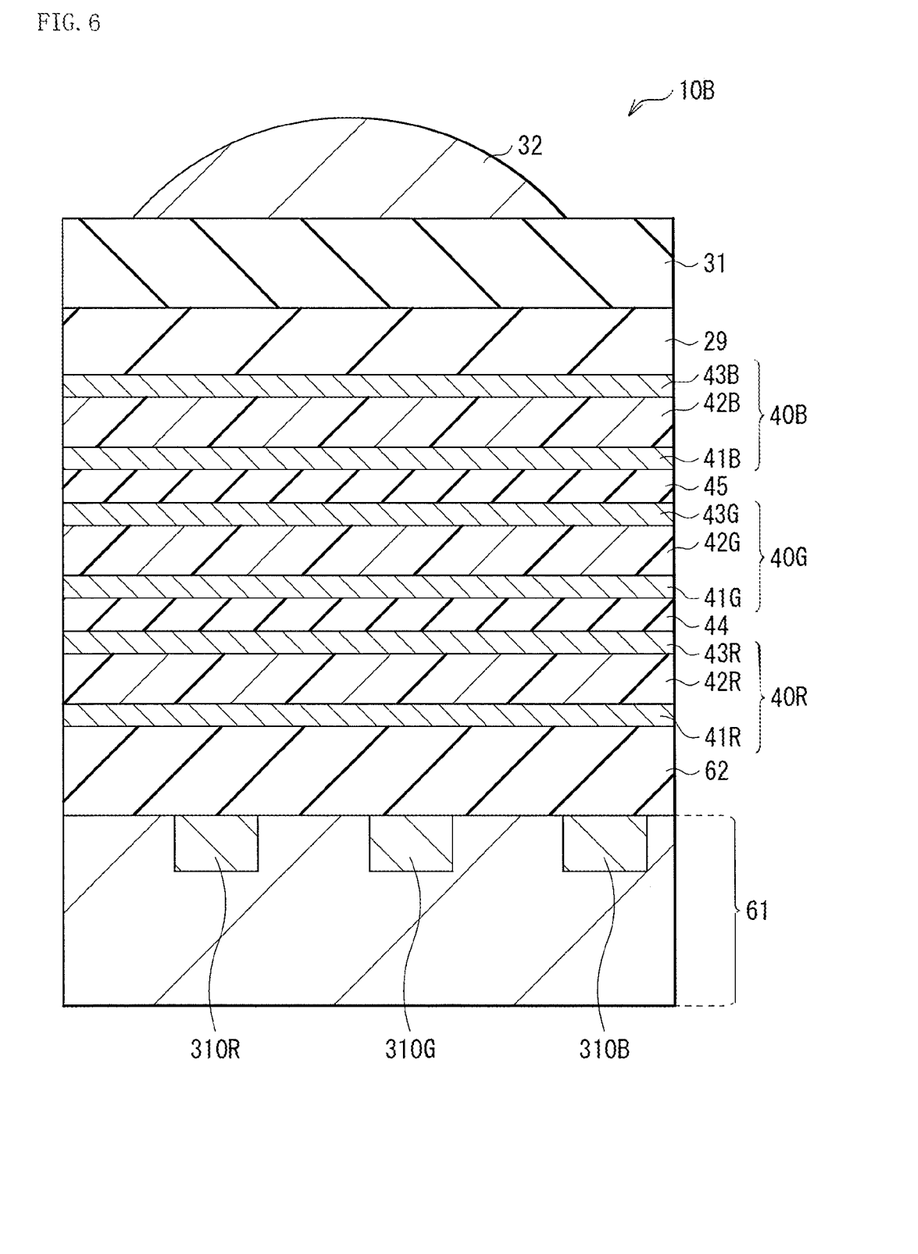
FIG. 6 is a diagram illustrating another configuration of the photoelectric conversion device including the photoelectric converter illustrated in FIG. 1.

FIG. 5 and FIG. 6 each illustrate a cross-sectional configuration of a photoelectric conversion device (the photoelectric conversion devices 10A and 10B) including the photoelectric converter 10 described in the above-described embodiment.

The photoelectric conversion device 10A includes a pixel transistor (including transfer transistors Tr1 to Tr3 described later) formed on a front surface (a surface S2 opposite a light reception surface) side of a semiconductor substrate 21, and includes a multilayer wiring layer (a multilayer wiring layer 51). This photoelectric conversion device 10A has a stacked configuration including one organic photoelectric converter 21G and two inorganic photoelectric converters 21B and 21R, each of which selectively detects light of a relevant one of wavelength regions different from one another, and performs photoelectric conversion. Hence, a color signal of each of red (R), green (G), and blue (B) is acquired by a single device. The organic photoelectric converter 21G is formed on a back surface (a surface S1) of the semiconductor substrate 21, and the inorganic photoelectric converters 21B and 21R are formed to be embedded in the semiconductor substrate 21. The organic photoelectric converter 21G has a configuration similar to the configuration of the photoelectric converter 10 described in the above-described embodiment. It is to be noted that the buffer layers 12 and 14 and the intermediate layer 12a are omitted in FIG. 5.

(Organic Photoelectric Converter 21G)

The organic photoelectric converter 21G is an organic photoelectric conversion device that generates a pair of an electron and a hole by absorbing light (here, green light) of a selective wavelength region through use of an organic semiconductor. The organic photoelectric converter 21G has such a configuration that an organic photoelectric conversion layer 27 is interposed between a pair of electrodes (a lower electrode 25a and an upper electrode 28) provided to extract a signal charge. As will be described later, the lower electrode 25a and the upper electrode 28 are electrically coupled to conductive plugs 220a1 and 220b1 embedded in the semiconductor substrate 21, through a wiring layer and a contact metal layer.

Specifically, in the organic photoelectric converter 21G, interlayer insulating films 22 and 24 are formed on the surface S1 of the semiconductor substrate 21, and the interlayer insulating film 22 has a through-hole in a region corresponding to each of the conductive plugs 220a1 and 220b1 described later. Further, conductive plugs 220a2 and 220b2 are embedded in the respective through-holes. In the interlayer insulating film 24, wiring layers 23a and 23b are embedded in a region corresponding to the conductive plug 220a2 and a region corresponding to the conductive plug 220b2, respectively. On this interlayer insulating film 24, the lower electrode 25a is provided, and a wiring layer 25b electrically separated by this lower electrode 25a and an insulating film 26 is provided. The organic photoelectric conversion layer 27 is formed on the lower electrode 25a of them, and the upper electrode 28 is formed to cover the organic photoelectric conversion layer 27. As will be described later in detail, a protective layer 29 is formed on the upper electrode 28 to cover a surface thereof. A contact hole H is provided in a predetermined region of the protective layer 29, and a contact metal layer 20 is so formed on the protective layer 29 as to be contained in the contact hole H and to extend to a top surface of the wiring layer 25b.

The conductive plug 220a2 serves as a connector together with the conductive plug 220a1, and forms a transmission path for an electric charge (an electron) from the lower electrode 25a to a green storage layer 210G described later, together with the conductive plug 220a1 and the wiring layer 23a. The conductive plug 220b2 serves as a connector together with the conductive plug 220b1, and forms a discharge path for an electric charge (a hole) from the upper electrode 28, together with the conductive plug 220b1, the wiring layer 23b, the wiring layer 25b, and the contact metal layer 30. Desirably, the conductive plugs 220a2 and 220b2 include, for example, a laminated film including metal materials such as titanium (Ti), titanium nitride (TiN), and tungsten, to also serve as a light-blocking film. In addition, such a laminated film is desirably used, which makes it possible to ensure contact with silicon even in a case where the conductive plugs 220a1 and 220b1 are each formed as an n-type or p-type semiconductor layer.

Desirably, the interlayer insulating film 22 is formed including an insulating film with a small interface state, so as to reduce an interface state with the semiconductor substrate 21 (a silicon layer 210), and suppress generation of a dark current from the interface with the silicon layer 210. As such an insulating film, for example, a laminated film including a hafnium oxide (HfO$_2$) film and a silicon oxide (SiO$_2$) film is usable. The interlayer insulating film 24 includes a single-layer film including one of materials such as silicon oxide, silicon nitride, and silicon oxynitride (SiON), or includes a laminated film including two or more of these materials.

The insulating film 26 includes, for example, a single-layer film including one of materials such as silicon oxide, silicon nitride, and silicon oxynitride (SiON) or a laminated film including two or more of these materials. For example, the insulating film 26 has a planarized surface, and has a shape and a pattern having almost no step with respect to the lower electrode 25a. In a case where the photoelectric conversion device 10A is used as a pixel of a solid-state imaging unit, this insulating film 26 has a function of performing electrical isolation between the lower electrodes 25a of the respective pixels.

The lower electrode 25a is provided in a region facing the light reception surface of each of the inorganic photoelectric converters 21B and 21R formed inside the semiconductor substrate 21, and covering these light reception surfaces. It is to be noted that in this photoelectric conversion device 10A, a signal charge is extracted from the lower electrode 25a, and thus in the solid-state imaging unit described later using the photoelectric conversion device 10A as the pixel, this lower electrode 25a is formed separately for each of the pixels.

The organic photoelectric conversion layer 27 has a configuration similar to that of the above-described photoelectric conversion layer 13. For an organic pigment, for example, a material that selectively absorbs light of 450 nm or more and 650 nm or less is used.

The upper electrode 28 is formed of a conductive film having light transparency similar to that of the lower electrode 25a. In the solid-state imaging unit using the photoelectric conversion device 10A as the pixel, this upper electrode 28 may be separated for each of the pixels, or may be formed as an electrode common to each of the pixels. The upper electrode 28 has a thickness of, for example, 10 nm to 200 nm both inclusive.

It is to be noted that for a material of the lower electrode 25a, a material of the organic photoelectric conversion layer 27, and a material of the upper electrode 28, it is possible to use the material for the lower electrode 11, the material for the photoelectric conversion layer 13, and the material for the upper electrode 15 of the above-described embodiment, respectively.

The protective layer 29 includes a material having light transparency, and is, for example, a single-layer film including one of materials such as silicon oxide, silicon nitride, and silicon oxynitride or a laminated film including two or more of these materials. This protective layer 29 has a thickness of, for example, 100 nm to 30000 nm both inclusive. It is to be noted that, for example, the upper electrode 28 and the protective layer 29 are provided to cover the organic photoelectric conversion layer 27.

The contact metal layer 30 includes, for example, one of materials such as titanium, tungsten, titanium nitride, and aluminum, or includes a laminated film including two or more of these materials.

A planarization layer 31 is formed on the protective layer 29 and the contact metal layer 30 to cover entire surfaces of the protective layer 29 and the contact metal layer 30. An on-chip lens 32 (a microlens) is provided on the planarization layer 31. The on-chip lens 32 collects light entering from a top thereof onto a light reception surface of each of an organic photoelectric conversion layer 11G and the inorganic photoelectric converters 21B and 21R. In the present embodiment, the multilayer wiring layer 51 is formed on the surface S2 side of the semiconductor substrate 21, which makes it possible to dispose the respective light reception surfaces of the organic photoelectric conversion layer 11G and the inorganic photoelectric converters 21B and 21R close to one another, and to reduce variation in sensitivity between respective colors that is caused depending on an F-number of the on-chip lens 32.

It is to be noted that in the photoelectric conversion device 10A, a signal charge is extracted from the lower electrode 25a, and thus in the solid-state imaging unit using this device as the pixel, the upper electrode 28 may be a common electrode. In this case, a transmission path including the contact hole H, the contact metal layer 30, the wiring layers 25b and 23b, and the conductive plugs 220b1 and 220b2 may be formed in at least one location for all the pixels.

In the semiconductor substrate 21, for example, the inorganic photoelectric converters 21B and 21R and the green storage layer 210G are so formed as to be embedded in a predetermined region of the n-type silicon (Si) layer 210. Further, the conductive plugs 220a1 and 220b1 configuring a transmission path for an electric charge (an electron or hole (a hole)) from the organic photoelectric converter 21G are embedded in the semiconductor substrate 21, and the back surface (the surface S1) of this semiconductor substrate 21 serves as the light reception surface. A plurality of pixel transistors (including the transfer transistors Tr1 to Tr3) corresponding to the organic photoelectric converter 21G and the inorganic photoelectric converters 21B and 21R and a peripheral circuit including a logic circuit, etc. are formed on the front surface (the surface S2) side of the semiconductor substrate 21.

The inorganic photoelectric converters 21B and 21R are each a photodiode (Photo Diode) having a pn junction, and are formed in order of the inorganic photoelectric converters 21B and 21R from the surface S1 side, in an optical path in the semiconductor substrate 21. Of these, the inorganic photoelectric converter 21B selectively detects blue light, and stores signal charges corresponding to blue. The inorganic photoelectric converter 21B is, for example, formed to extend from a selective region along the surface S1 of the semiconductor substrate 21 to a region in proximity to an interface with the multilayer wiring layer 51. The inorganic photoelectric converter 21R selectively detects red light, and stores signal charges corresponding to red. The inorganic photoelectric converter 21R is, for example, formed over a region below the inorganic photoelectric converter 21B (on the surface S2 side). It is to be noted that blue (B) corresponds to, for example, a wavelength region of 450 nm to 495 nm both inclusive, and red (R) corresponds to, for example, a wavelength region of 620 nm to 750 nm both inclusive. The inorganic photoelectric converters 21B and 21R may each be able to detect part or all of light of the corresponding wavelength region.

The multilayer wiring layer 51 is formed on the surface S2 of the semiconductor substrate 21. In the multilayer wiring layer 51, a plurality of wiring lines 51a are disposed with an interlayer insulating film 52 interposed therebetween. In the photoelectric conversion device 10A, the multilayer wiring layer 51 is thus formed on the side opposite the light reception surface, and it is possible to realize a so-called back-side illumination type solid-state imaging unit. For example, a supporting substrate 53 including silicon is adhered to this multilayer wiring layer 51.

The photoelectric conversion device 10B includes a red photoelectric converter 20R, a green photoelectric converter 20G, and a blue photoelectric converter 20B in this order on a silicon substrate 61 with an insulating layer 62 interposed therebetween. Each of photoelectric converters 40R, 40G and 40B has a configuration similar to that of the photoelectric converter 10 of the above-described embodiment. It is to be noted that in FIG. 6, the buffer layers 12 and 14, and the intermediate layer 12a are omitted as in FIG. 5.

The photoelectric conversion device 10R has, as described above, a configuration in which the red photoelectric converter 40R, the green photoelectric converter 40G, and the blue photoelectric converter 40B are stacked in this order on the silicon substrate 61 with the insulating layer 62 interposed therebetween. The on-chip lens 32 is disposed on the blue photoelectric converter 40B, with the protective layer 29 and the planarization layer 31 disposed therebetween. A red electric storage layer 310R, a green electric storage layer 3100G and a blue electric storage layer 310B are provided inside the silicon substrate 61. Light entering the on-chip lens 32 is photoelectrically converted by the red photoelectric converter 40R, the green photoelectric converter 400, and the blue photoelectric converter 40B. Signal charges are then transmitted from the red photoelectric converter 40R to the red electric storage layer 310R, from the green photoelectric converter 40G to the green electric storage layer 310G, and from the blue photoelectric converter 40B to the blue electric storage layer 310B.

It is to be noted that for a material of each of first electrodes 41R, 41, and 41B, a material of each of organic photoelectric conversion layers 42R, 42Q, and 42B, and a material of each of second electrodes 43R, 43G, and 43B respectively forming the red photoelectric converter 40R, the green photoelectric converter 40G, and the blue photoelectric converter 40B, it is possible to use the material for the lower electrode 11, the material for the photoelectric conversion layer 13, and the material for the upper electrode 15 of the above-described embodiment, respectively.

Figure 7:
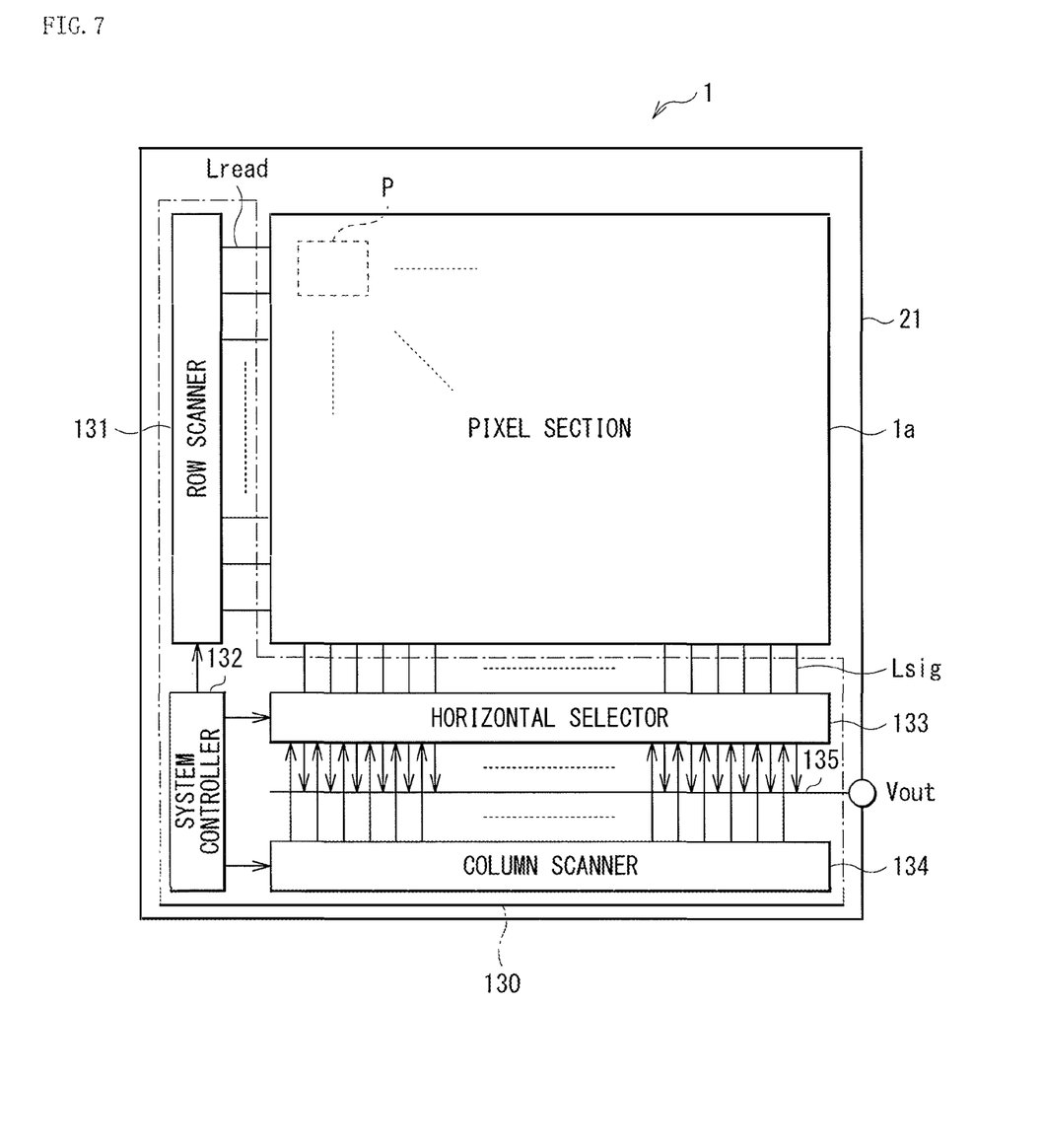
FIG. 7 is a diagram illustrating a schematic configuration of an imaging unit including the photoelectric conversion device illustrated in FIG. 5 or FIG. 6.

FIG. 7 illustrates an overall configuration of the solid-state imaging unit (the solid-state imaging unit 1) using the above-described photoelectric conversion device 10A or the photoelectric conversion device 10B for each of the pixels. This solid-state imaging unit 1 is a CMOS image sensor, and includes a pixel section 1a as an imaging area at a central portion on the semiconductor substrate 21. A peripheral circuit section 130 is provided in a peripheral region of the pixel section 1a, and includes, for example, a row scanner 131, a system controller 132, a horizontal selector 133, and a column scanner 134.

The pixel section 1a includes, for example, a plurality of unit pixels P (corresponding to the photoelectric converters 10, 10A, and 10B) that are two-dimensionally arranged in rows and columns. For example, the unit pixels P are wired with pixel driving lines Lread (specifically, row selection lines and reset control lines) for respective pixel rows, and are wired with vertical signal lines Lsig for respective pixel columns. The pixel driving lines Lread transmit drive signals for signal reading from the pixels. The pixel driving lines Lread each have one end coupled to a corresponding one of output terminals, corresponding to the respective rows, of the row scanner 131.

The row scanner 131 is, for example, a pixel driver that includes a shift register, an address decoder, etc., and drives the pixels P of the pixel section 1a on a row basis. A signal outputted from each of the pixels P of a pixel row selected by the row scanner 131 is supplied to the horizontal selector 133 through each of the vertical signal lines Lsig. The horizontal selector 133 includes, for example, an amplifier, a horizontal selection switch, etc. that are provided for each of the vertical signal lines Lsig.

The column scanner 134 includes a shift register, an address decoder, etc., and drives the horizontal selection switches of the horizontal selector 133 in order while sequentially performing scanning of those horizontal selection switches. Such selection and scanning performed by the column scanner 134 allow the signals of the pixels P transmitted through the respective vertical signal lines Lsig to be sequentially outputted to a horizontal signal line 135. The thus-outputted signals are transmitted to outside of the semiconductor substrate 21 through the horizontal signal line 135.

A circuit portion including the row scanner 131, the horizontal selector 133, the column scanner 134, and the horizontal signal line 135 may be provided directly on the semiconductor substrate 21, or may be disposed in an external control IC. Alternatively, the circuit portion may be provided in any other substrate coupled by means of a cable or the like.

The system controller 132 receives a clock supplied from the outside of the semiconductor substrate 21, data on instructions of operation modes, and the like, and outputs internal information of the solid-state imaging unit 1. In addition, the system controller 132 includes, for example, a timing generator that generates various timing signals. The system controller 132 performs drive control of peripheral circuits such as the row scanner 131, the horizontal selector 133, and the column scanner 134 on the basis of the various timing signals generated by the timing generator.

Figure 8:
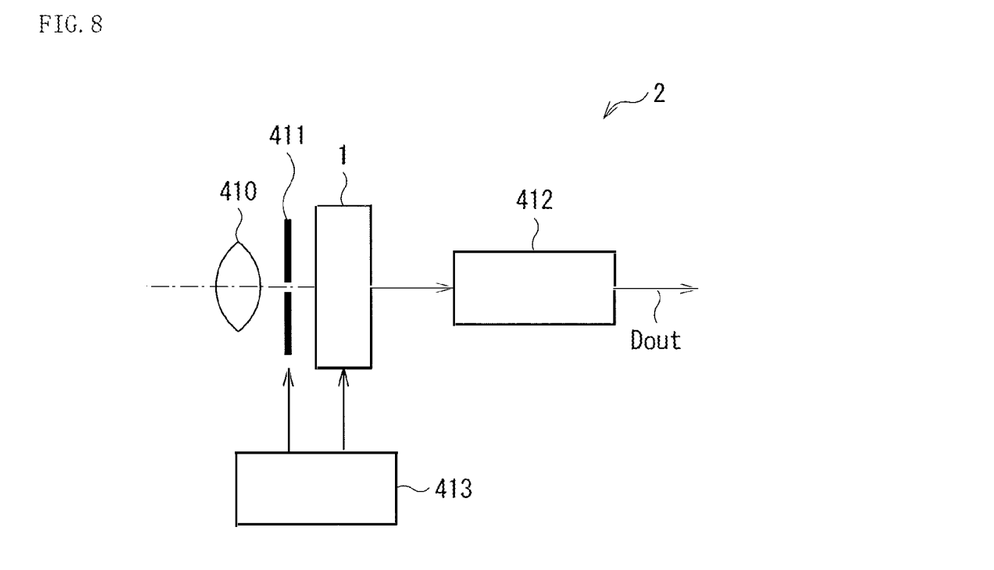
FIG. 8 is a diagram illustrating a schematic configuration of an electronic apparatus to which the imaging unit illustrated in FIG. 7 is applied.

The solid-state imaging unit 1 described above is mountable in all types of electronic apparatuses each having an imaging function. The solid-state imaging unit 1 is applicable to, for example, camera systems such as a digital still camera and a video camera, and to a mobile phone and the like. FIG. 8 illustrates a schematic configuration of a camera (an electronic apparatus 2), as an example. The electronic apparatus 2 is, for example, a video camera that allows for shooting of a still image or a moving image, and includes the solid-state imaging unit 1, an optical system (an optical lens) 310, a shutter unit 311, a signal processor 312, and a driver 313.

The optical system 310 guides image light (incident light) from a subject to the pixel section 1a of the solid-state imaging unit 1. The optical system 310 may include a plurality of optical lenses. The shutter unit 311 controls a period in which the solid-state imaging unit 1 is irradiated with the light and a period in which the light is blocked, and the driver 313 controls a shutter operation of this shutter unit 311 and a transfer operation of the solid-state imaging unit 1. The signal processor 312 performs various signal processes on signals outputted from the solid-state imaging unit 1. A picture signal Dout having been subjected to the signal processes is, for example, stored in a storage medium such as a memory, or outputted to a monitor or the like.

3. Examples

Next, examples of the technology will be described in detail.
(Fabrication of Photoelectric Converter)

Experimental Example 1

A photoelectric converter was fabricated by the following procedure. First, for example, a buffer layer including NiO was formed with a thickness of 20 nm by sputtering on a lower electrode including ITO, and then a laminated film including ITO and NiO was immersed in, for example, an MPA methanol solution (MPA in MeOH (0.12 mol/L)) for 20 hours. Subsequently, the laminated film was immersed in acetonitrile (MeCN) for 1 minute, and then dried by air blowing. Next, for example, a quinacridone (QD) film was formed using vapor deposition to form a photoelectric conversion layer. Thereafter, for example, an AlSiCu film was formed using vapor deposition to form an upper electrode, thereby fabricating a photoelectric converter (a sample 1). Further, a photoelectric converter (a sample 2) was fabricated as a comparative example by forming a photoelectric conversion layer and an upper electrode without immersion of a formed NiO film into an MPA methanol solution, and the like.

Figure 9:
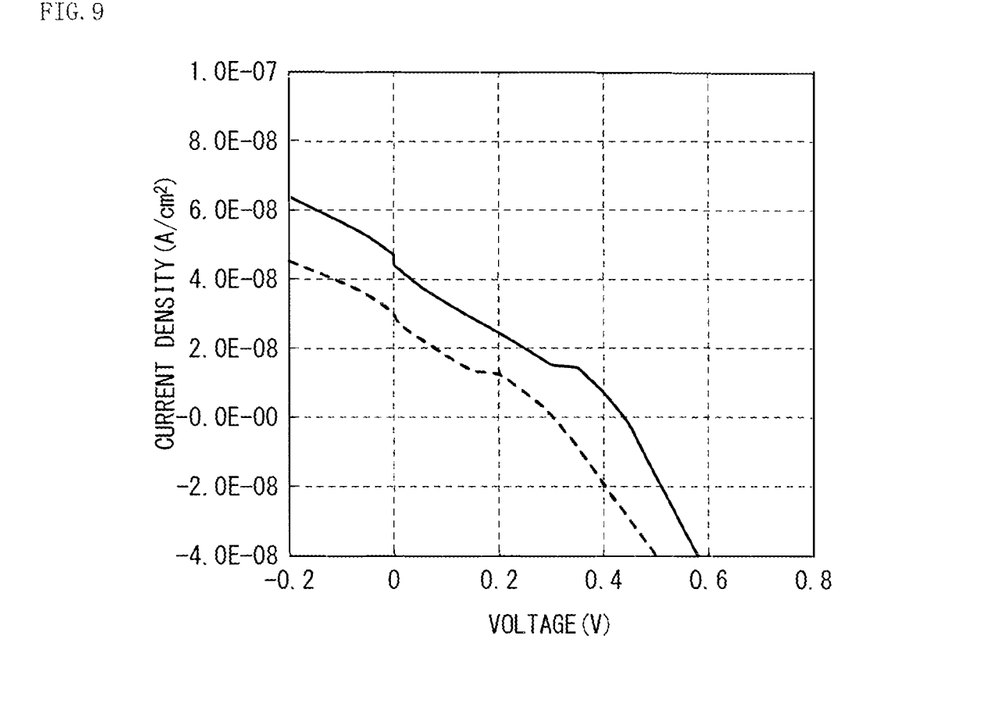
FIG. 9 is a characteristic diagram illustrating a relationship between current density and voltage during application of light.

The samples 1 and 2 were irradiated with light (1.62 $\mu W/cm^2$) to measure EQE. FIG. 9 illustrates a relationship between current density and voltage at 1.62 $\mu W/cm^2$. Table 1 illustrates EQE and electromotive force (Voc) at −1 V of each of the samples 1 and 2. As can be seen from FIG. 9, an abrupt rise of the current density in a positive voltage range was confirmed in the sample 1, as compared with the sample 2. In other words, it was found that EQE was enhanced by providing an intermediate layer on a surface of a buffer layer, i.e., by terminating a surface state present on the surface of the buffer layer. In addition, as illustrated in Table 1, Voc (V) in the sample 1 was larger than that in the sample 2. From this, it was found that an optimal characteristic was obtainable in a case of an application to a solar battery as well.

TABLE 1

|  | Sample 1 | Sample 2 |
| --- | --- | --- |
| EQE | 16.4 | 11.7 |
| Voc | 0.45 | 0.33 |

Although the technology has been described above referring to the embodiment, the application examples and the examples, the technology are not limited thereto, and may be modified in a variety of ways. For example, in the above-described application example, there is described the photoelectric conversion device in which the red photoelectric converter 40R, the green photoelectric converter 40G, and the blue photoelectric converter 40B are stacked. However, a photoelectric conversion device may include two photoelectric converters, or a photoelectric conversion device may include a single-layer photoelectric converter.

Further, in the above-described application example, there is described the example in which the red photoelectric converter 40R, the green photoelectric converter 40G, and the blue photoelectric converter 40B are stacked in this order from the silicon substrate 61 side. However, for example, in a case where an absorption wavelength of a semiconductor nanoparticle is, for example, 400 nm or less, a stacking order is not limited thereto. In a case where a semiconductor nanoparticle 222 has, for example, an absorption wavelength in a visible light region of 400 nm or more, a photoelectric converter using a semiconductor nanoparticle having absorption in a short wavelength is preferably disposed on light-incident side.

Furthermore, it is not necessary to provide all the components of the above-described embodiment, and moreover, other component may be provided. For example, any other unillustrated layer may be provided between the organic photoelectric conversion layer 27 and the lower electrode 25a, and between the organic photoelectric conversion layer 27 and the upper electrode 28. For example, an undercoating film, a hole transport layer, the organic photoelectric conversion layer 27, an electron transport layer, and a work-function adjustment film may be stacked in this order from the lower electrode 25a side.

It is to be noted that the effects described herein are mere examples and non-limiting, and other effects may also be provided.

It is to be noted that the technology may adopt the following configurations.

(1)
A photoelectric conversion device including:
a first electrode and a second electrode facing each other;
a photoelectric conversion layer provided between the first electrode and the second electrode; and
a buffer layer provided between the first electrode and the photoelectric conversion layer, and having an interface, to which an organic molecule or a halogen element is coordinated, with the photoelectric conversion layer.

(2)
The photoelectric conversion device according to (1), in which an intermediate layer including the organic molecule or the halogen element is included between the buffer layer and the photoelectric conversion layer.

(3)
The photoelectric conversion device according to (1) or (2), in which the organic molecule includes at least one adsorptive functional group.

(4)
The photoelectric conversion device according to any one of (1) to (3), in which the buffer layer includes an inorganic material.

(5)
The photoelectric conversion device according to any one of (1) to (4), in which the photoelectric conversion layer includes an organic pigment.

(6)
The photoelectric conversion device according to (5), in which
the organic molecule includes a first adsorptive functional group and a second adsorptive functional group with a main chain provided therebetween, and
the organic molecule is bonded to an inorganic material of the buffer layer through the first adsorptive functional group, and to the organic pigment of the photoelectric conversion layer through the second adsorptive functional group.

(7)
The photoelectric conversion device according to (5) or (6), in which
the organic molecule includes a first adsorptive functional group and one of a hydrogen atom and a halogen element with a main chain provided therebetween, and
the organic molecule is bonded to an inorganic material of the buffer layer through the first adsorptive functional group, and to the organic pigment of the photoelectric conversion layer through the hydrogen atom or the halogen element.

(8)
The photoelectric conversion device according to (6) or (7), in which the main chain is a straight-chain hydrocarbon, a chain hydrocarbon having a side chain, or an aromatic hydrocarbon.

(9)
The photoelectric conversion device according to any one of (5) to (8), in which
the organic molecule includes a first adsorptive functional group and one of a second adsorptive functional group, a hydrogen atom and a halogen element with a main chain provided therebetween, and the organic molecule has a length of 1 nm or less from the first adsorptive functional group to the second adsorptive functional group, the hydrogen atom, or halogen element.

(10)
The photoelectric conversion device according to any one of (6) to (9), in which each of the first adsorptive functional group and the second adsorptive functional group is one of a carboxyl (—COOH) group, a mercapto (—SH) group, a phosphonyl (>P=O) group, and a phosphonic acid (—P(=O)(OH)$_2$) group.

(11)
The photoelectric conversion device according to any one of (4) to (10), in which the inorganic material includes one of nickel oxide (NiO), titanium oxide (TiO$_2$), zinc oxide (ZnO), and zinc sulphide (ZnS).

(12)
The photoelectric conversion device according to any one of (1) to (11), in which the photoelectric conversion layer includes one of an inorganic semiconductor, a colloidal quantum dot, and an organic-inorganic perovskite.

(13)
An imaging device provided with pixels each including one or a plurality of organic photoelectric converters, each of the organic photoelectric converters including:
a first electrode and a second electrode facing each other;
a photoelectric conversion layer provided between the first electrode and the second electrode, and
a buffer layer provided between the first electrode and the photoelectric conversion layer, and having an interface, to which an organic molecule or a halogen element is coordinated, with the photoelectric conversion layer.

This application is based upon and claims priority from Japanese Patent Application No. 2015-201439 filed with the Japan Patent Office on Oct. 9, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion device, comprising:
a first electrode and a second electrode facing each other;
a photoelectric conversion layer provided between the first electrode and the second electrode; and
a buffer layer provided between the first electrode and the photoelectric conversion layer, and having an interface, to which an organic molecule or a halogen element is coordinated, with the photoelectric conversion layer,
wherein the photoelectric conversion layer includes an organic pigment,
wherein the organic molecule includes a first adsorptive functional group and a second adsorptive functional group with a main chain provided therebetween, and
wherein the organic molecule is bonded to an inorganic material of the buffer layer through the first adsorptive functional group, and to the organic pigment of the photoelectric conversion layer through the second adsorptive functional group.

2. The photoelectric conversion device according to claim 1, wherein an intermediate layer including the organic molecule or the halogen element is included between the buffer layer and the photoelectric conversion layer.

3. The photoelectric conversion device according to claim 1, wherein the organic molecule includes at least one adsorptive functional group.

4. The photoelectric conversion device according to claim 1, wherein the buffer layer includes an inorganic material.

5. The photoelectric conversion device according to claim 1, wherein the main chain is a straight-chain hydrocarbon, a chain hydrocarbon having a side chain, or an aromatic hydrocarbon.

6. The photoelectric conversion device according to claim 5, wherein an intermediate layer including the organic molecule or the halogen element is included between the buffer layer and the photoelectric conversion layer.

7. The photoelectric conversion device according to claim 5, wherein the organic molecule includes at least one adsorptive functional group.

8. The photoelectric conversion device according to claim 5, wherein the buffer layer includes an inorganic material.

9. The photoelectric conversion device according to claim 1, wherein each of the first adsorptive functional group and the second adsorptive functional group is one of a carboxyl (—COOH) group, a mercapto (—SH) group, a phosphonyl (P=O) group, and a phosphonic acid (—P(=O)(OH)$_2$) group.

10. The photoelectric conversion device according to claim 9, wherein an intermediate layer including the organic molecule or the halogen element is included between the buffer layer and the photoelectric conversion layer.

11. The photoelectric conversion device according to claim 9, wherein the organic molecule includes at least one adsorptive functional group.

12. The photoelectric conversion device according to claim 1, wherein the inorganic material includes one of nickel oxide (NiO), titanium oxide (TiO$_2$), zinc oxide (ZnO), and zinc sulphide (ZnS).

13. The photoelectric conversion device according to claim 1, wherein the photoelectric conversion layer includes one of an inorganic semiconductor, a colloidal quantum dot, and an organic-inorganic perovskite.

14. A photoelectric conversion device, comprising:
a first electrode and a second electrode facing each other;
a photoelectric conversion layer provided between the first electrode and the second electrode; and
a buffer layer provided between the first electrode and the photoelectric conversion layer, and having an interface, to which an organic molecule or a halogen element is coordinated, with the photoelectric conversion layer,
wherein the photoelectric conversion layer includes an organic pigment,
wherein the organic molecule includes a first adsorptive functional group and one of a hydrogen atom and a halogen element with a main chain provided therebetween, and
wherein the organic molecule is bonded to an inorganic material of the buffer layer through the first adsorptive functional group, and to the organic pigment of the photoelectric conversion layer through the hydrogen atom or the halogen element.

15. The photoelectric conversion device according to claim 14, wherein an intermediate layer including the organic molecule or the halogen element is included between the buffer layer and the photoelectric conversion layer.

16. The photoelectric conversion device according to claim 14, wherein the organic molecule includes at least one adsorptive functional group.

17. The photoelectric conversion device according to claim 14, wherein the buffer layer includes an inorganic material.

18. A photoelectric conversion device, comprising:
a first electrode and a second electrode facing each other;
a photoelectric conversion layer provided between the first electrode and the second electrode; and
a buffer layer provided between the first electrode and the photoelectric conversion layer, and having an interface, to which an organic molecule or a halogen element is coordinated, with the photoelectric conversion layer,
wherein the photoelectric conversion layer includes an organic pigment,
wherein the organic molecule includes a first adsorptive functional group and one of a second adsorptive functional group, a hydrogen atom, and a halogen element with a main chain provided therebetween, and
wherein the organic molecule has a length of 1 nm or less from the first adsorptive functional group to the second adsorptive functional group, the hydrogen atom, or halogen element.

19. The photoelectric conversion device according to claim 18, wherein an intermediate layer including the organic molecule or the halogen element is included between the buffer layer and the photoelectric conversion layer.

20. The photoelectric conversion device according to claim 18, wherein the organic molecule includes at least one adsorptive functional group.

* * * * *